(12) United States Patent
Lee et al.

(10) Patent No.: US 7,739,441 B1
(45) Date of Patent: Jun. 15, 2010

(54) COMMUNICATING BETWEEN A NATIVE FULLY BUFFERED DUAL IN-LINE MEMORY MODULE PROTOCOL AND A DOUBLE DATA RATE SYNCHRONOUS DYNAMIC RANDOM ACCESS MEMORY PROTOCOL

(75) Inventors: Teddy Lee, Roseville, CA (US); Michael Bozich Calhoun, Roseville, CA (US); Dennis Carr, Roseville, CA (US); Ricardo Ernesto Espinoza-Ibarra, San Diego, CA (US); Lidia Warnes, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 504 days.

(21) Appl. No.: 11/796,748

(22) Filed: Apr. 30, 2007

(51) Int. Cl.
*G06F 13/36* (2006.01)
(52) U.S. Cl. .................. 710/315; 710/308; 710/306
(58) Field of Classification Search .......... 710/306–315, 710/52–57; 711/111–114, 154–156; 365/51, 365/189.05, 189.17, 189.2, 191, 219, 233.13
See application file for complete search history.

(56) References Cited

U.S. PATENT DOCUMENTS

| | | | |
|---|---|---|---|
| 6,215,727 B1 | 4/2001 | Parson et al. | |
| 6,347,367 B1 | 2/2002 | Dell et al. | |
| 6,392,946 B1 | 5/2002 | Wu et al. | |
| 6,467,048 B1 | 10/2002 | Olarig et al. | |
| 6,507,888 B2* | 1/2003 | Wu et al. | 711/105 |
| 6,779,075 B2 | 8/2004 | Wu et al. | |
| 6,826,113 B2 | 11/2004 | Ellis et al. | |
| 7,143,298 B2 | 11/2006 | Wells et al. | |
| 7,379,316 B2* | 5/2008 | Rajan | 365/63 |
| 7,475,316 B2* | 1/2009 | Cowell et al. | 714/734 |
| 7,532,537 B2* | 5/2009 | Solomon et al. | 365/230.06 |
| 7,539,810 B2* | 5/2009 | Gower et al. | 710/310 |
| 7,577,039 B2* | 8/2009 | Yang et al. | 365/189.05 |
| 2006/0047899 A1 | 3/2006 | Ilda et al. | |
| 2006/0146629 A1 | 7/2006 | Lee | |
| 2006/0155517 A1 | 7/2006 | Dobbs et al. | |
| 2007/0192563 A1* | 8/2007 | Rajan et al. | 711/202 |
| 2008/0077731 A1 | 3/2008 | Forrest et al. | |
| 2008/0091888 A1 | 4/2008 | Sandy | |
| 2008/0126690 A1 | 5/2008 | Rajan et al. | |
| 2008/0181021 A1 | 7/2008 | Thayer | |
| 2008/0250292 A1 | 10/2008 | Djordjevic | |
| 2008/0256281 A1 | 10/2008 | Fahr et al. | |
| 2009/0101711 A1* | 4/2009 | Grayson | 235/382.5 |

OTHER PUBLICATIONS

*JEDEC Standatd, FBDIMM: Architecture and Protocol, JESD206. PDF* © JEDEC Solid State Technology Association 2007, Arlington, Virginia http://www.jedec.org/download/search/JESD206.pdf Section 2.1.3 (AMB addressing) table 2-4 showing the DS [3:0] usage.

(Continued)

*Primary Examiner*—Raymond N Phan

(57) ABSTRACT

A translator of an apparatus in an example communicatively interconnects a serial protocol bus that follows a native fully buffered dual in-line memory module protocol (native FB-DIMM protocol) and three or more parallel protocol memory module channels that comprise a plurality of double data rate registered and/or unbuffered dual in-line memory modules (DDR registered and/or unbuffered DIMMs).

18 Claims, 10 Drawing Sheets

OTHER PUBLICATIONS

Same Document Section 2.1.3 paragraph 3 shows that for DRAM addressing one can only use DS [2:0].

Same Document Section 4.2.3 find the FBD command encoding protocol. This is the same protocol that would be used by disclosure 63, this table also shows the RS (rank selection bit).

Same Document Section 4.2.4 find information on DRAM commands and a DRAM comman mapping example—this section (paragraph 3) explains the use of the RS bit according to the FBD spec.

Same Document Section 4.4.2 gives a write timing example and describes the use of write FIFOs by the AMB.

Same Document Section 4.4.2.1 describes the use of the WS bits according to the FBD protocol.

* cited by examiner

COMMUNICATING BETWEEN A NATIVE FULLY BUFFERED DUAL IN-LINE MEMORY MODULE PROTOCOL AND A DOUBLE DATA RATE SYNCHRONOUS DYNAMIC RANDOM ACCESS MEMORY PROTOCOL

BACKGROUND

DIMM (dual in-line memory module) technology has random access memory (RAM) integrated circuits (ICs) mounted on a printed circuit board (PCB). Various types of DIMMs exist. DDR SDRAM (Double Data Rate Synchronous Dynamic Random Access Memory) DIMM technology has a parallel external interface. Fully buffered DIMM or FB-DIMM technology has a serial external interface.

FB-DIMM technology employs an Advanced Memory Buffer (AMB) having a serial connection to a memory controller, and a parallel connection to dynamic random access memory (DRAM). The AMB on each FB-DIMM translates the communication in serial point-to-point link protocol received from the memory host controller to DDR2 or DDR3 SDRAM parallel protocol transmitted to the DRAMs as read, write, refresh, etc. operations within the DIMM.

FB-DIMM architecture uses a southbound (SB) high speed link to send command and write data information from the memory host controller to the AMB on each FB-DIMM and a northbound (NB) high speed link to transfer read data from the AMBs on the FB-DIMMs to the memory host controller. The AMBs transfer read/write command and data to the DRAMs on each FB-DIMM. The high speed serial link interface between the memory host controller and the FB-DIMMs employs frames having cyclic redundancy check (CRC) with the data to transfer the data. The interface between each AMB and the DRAMs uses the DDR2 or DDR3 SDRAM parallel protocol to transfer data, address, and control.

DESCRIPTION OF THE DRAWINGS

Features of exemplary implementations of the invention will become apparent from the description, the claims, and the accompanying drawings in which:

DETAILED DESCRIPTION

Figure 1:
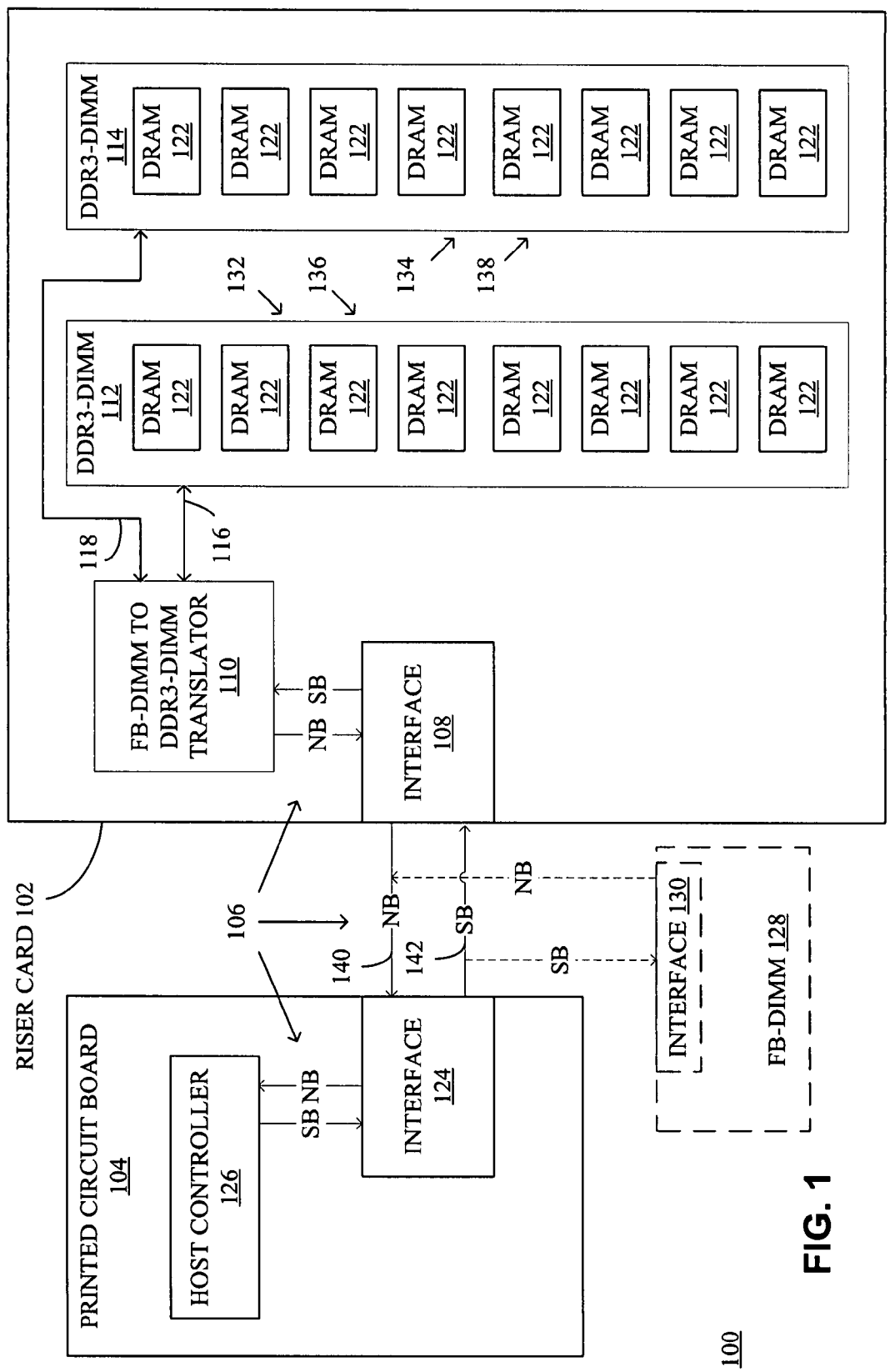
FIG. 1 is a representation of an implementation of an apparatus that comprises one or more riser boards and/or cards, a system board and/or printed circuit board (PCB), one or more serial protocol busses, one or more parallel protocol memory modules, and one or more parallel protocol busses.

Referring to the BACKGROUND section above, the memory controller on the FB-DIMM interface and/or link may schedule three or more back-to-back READ transactions. After some latency, the FB-DIMM protocol expects the three or more read transactions to be serviced and with data returned on adjacent frames.

If one does not want to modify the memory host controller interface but wants to reduce the number of AMBs in the system in an example one may install an exemplary translator on the PCB or a riser card. An exemplary translator serves to communicate with the memory host controller on the SB and NB high speed serial interface and drive up to sixteen (16) ranks through a DDR-DIMM interface. An exemplary rank comprises all the DRAM devices that can be selected by a select signal. An exemplary select signal comprises a chip select signal. The DDR-DIMM interface of the translator in an example may be connected to industry standard registered and/or unbuffered DDR-DIMMs that do not employ AMBs. The DDR-DIMM interface of the translator in an example may support one or two DDR channels. An exemplary channel comprises all the DDR-DIMMs that are connected to a DDR data bus.

Current FB-DIMM technology employs an expensive and power-hungry AMB device on each FB-DIMM installed in the system. The current FB-DIMM protocol allows for a maximum per FB-DIMM channel of eight (8) DDR DIMMs that each comprises two (2) ranks of DRAM devices. Under the current FB-DIMM protocol, each FB-DIMM comprises an AMB that can select a maximum of two (2) ranks of DRAM devices. The AMB increases the cost of the FB-DIMM. The AMB consumes a relatively large amount of power, making the power and cooling of the system more expensive and/or difficult in using the FB-DIMM technology.

An exemplary approach allows employment of an existing standard such as FB-DIMM protocol and an existing memory controller design. An exemplary translator allows employment of parallel protocol DIMMs instead of the expensive, power hungry serial protocol FB-DIMMs. An exemplary implementation architects a select operation of the translator, for example, an IC and/or chip select operation. An exemplary implementation omits the AMBs and instead employs a single FB-DIMM protocol to DDR translator to select up to, for example, sixteen (16) ranks. The translator in an example is installed on the PCB or a riser card. An exemplary implementation accommodates and/or employs a standard FB-DIMM high-speed interface while increasing bandwidth and capacity of a memory subsystem. An exemplary implementation serves to select DDR-DIMMs for one or more DDR channels. The FB-DIMM protocol provides for three (3) FB-DIMM select bits (binary digits) DS0 to DS2 and a rank select bit RS. An existing memory host controller drives these bits to select one of the eight (8) two (2) rank FB-DIMMs that may be installed in an FB-DIMM channel. Instead of the previous employment of the bits to select FB-DIMMs, an exemplary translator may employ the bits to select ranks on registered and/or unbuffered DDR-DIMMs that do not employ AMBs. An exemplary employment of an FB-DIMM protocol to DDR translator serves to address the maximum number of ranks allowed by the FB-DIMM protocol, for example, with just one FB-DIMM protocol to DDR translator serving to drive the eight (8) DDR DIMMs, reducing the system cost, and/or simplifying, enhancing, and/or reducing requirements for power and/or cooling.

FB-DIMMs are based on serial data transfer technology while DDR3 SDRAM DIMMs are based on parallel data transfer technology. An exemplary implementation allows both different memory technologies to be used in a same package. Full memory speed for both FB-DIMMs and DDR3 SDRAM DIMMs in an example is achievable. An exemplary translator comprises a translator riser card or board. The riser card or board in an example comprises a circuit card or board that connects directly to the PCB and allows addition of cards to the PCB by connection through the riser card. Another exemplary implementation omits the riser card and locates the translator in the PCB. In an exemplary implementation, a total number of DDR DIMM connectors on the riser card outside the PCB can be the same as a total number of FB-DIMM connectors on the PCB. An exemplary approach allows a user to choose between serial and parallel memory technologies without loss in a total quantity of DDR DIMM modules and FBDIMM modules allowable in the system regardless of the memory technology the user and/or customer chooses to use.

An exemplary translation from the FB-DIMM protocol serial interface to a lower-speed DDR 2 or 3 interface, an exemplary three or more back-to-back READ transactions in an example need accommodation and/or assistance to service the transactions and return data sufficiently on time from an exemplary parallel, multi-drop DDR 2 or 3 bus. An exemplary approach services three or more back-to-back FB-DIMM READ transactions in a DDR 2 or 3 translator. An exemplary implementation adds additional DDR channels an exemplary FB-DIMM protocol to DDR translator, for example, to enable back-to-back READ transactions and improve performance.

An exemplary implementation employs three or more parallel DDR 2 or 3 multi-drop busses connected to the translator and logic that allows for cache-line interleaving between the three or more DDR busses. The three or more DDR busses physically allow three or more back-to-back READ transactions to be serviced. Exemplary interleaving of cache lines between the three channels allows back-to-back READ transactions to avoid latency otherwise associated with serializing the three or more READ transactions to a same channel.

An exemplary approach allows an FB-DIMM protocol to DDR translator to be transparent to an FB-DIMM memory controller. An exemplary implementation allows the use of lower-cost industry standard DIMMs on the lower-speed interface without modification to the FB-DIMM memory controller. An exemplary approach increases, improves, and/or enhances performance since three or more independent channels each have a READ buffer that serves to reduce READ latencies.

Turning to FIGS. 1 through 4, an implementation of an apparatus 100 in an example comprises one or more riser boards and/or cards 102, a system board and/or printed circuit board (PCB) 104, one or more serial protocol busses 106, one or more parallel protocol memory modules 112, 114, 602 (FIG. 6), 604 (FIG. 6), 802 (FIG. 6), 804 (FIG. 6), 806 (FIG. 6), 808 (FIG. 6), and one or more parallel protocol busses 116, 118. The serial protocol bus 106 in an example comprises a high speed serial bus. Exemplary implementations of the serial protocol bus 106 comprise industry standard high speed serial busses such as FBD (fully buffered DIMM; FB-DIMM), PCI-express (PCIe), and HTx (hyper-transport) busses. One or more exemplary implementations employ plural rank parallel memory modules, such as two-rank and/or four-rank parallel memory modules, as one or more of the parallel protocol memory modules 112, 114, 602, 604, 802, 804, 806, 808. An exemplary rank comprises all the parallel memory devices 122 that can be selected by an individual select signal.

An exemplary implementation employs an exemplary logical association and/or assignment in connection with the parallel protocol memory modules such as parallel protocol memory module 112 corresponds to logic value zero (0), parallel protocol memory module 114 corresponds to logic value one (1), parallel protocol memory module 602 (FIG. 6) corresponds to logic value two (2), parallel protocol memory module 604 (FIG. 6) corresponds to logic value three (3), parallel protocol memory module 802 (FIG. 6) corresponds to logic value four (4), parallel protocol memory module 804 (FIG. 6) corresponds to logic value five (5), parallel protocol memory module 806 (FIG. 6) corresponds to logic value six (6), and parallel protocol memory module 808 (FIG. 6) corresponds to logic value seven (7).

Figure 5:
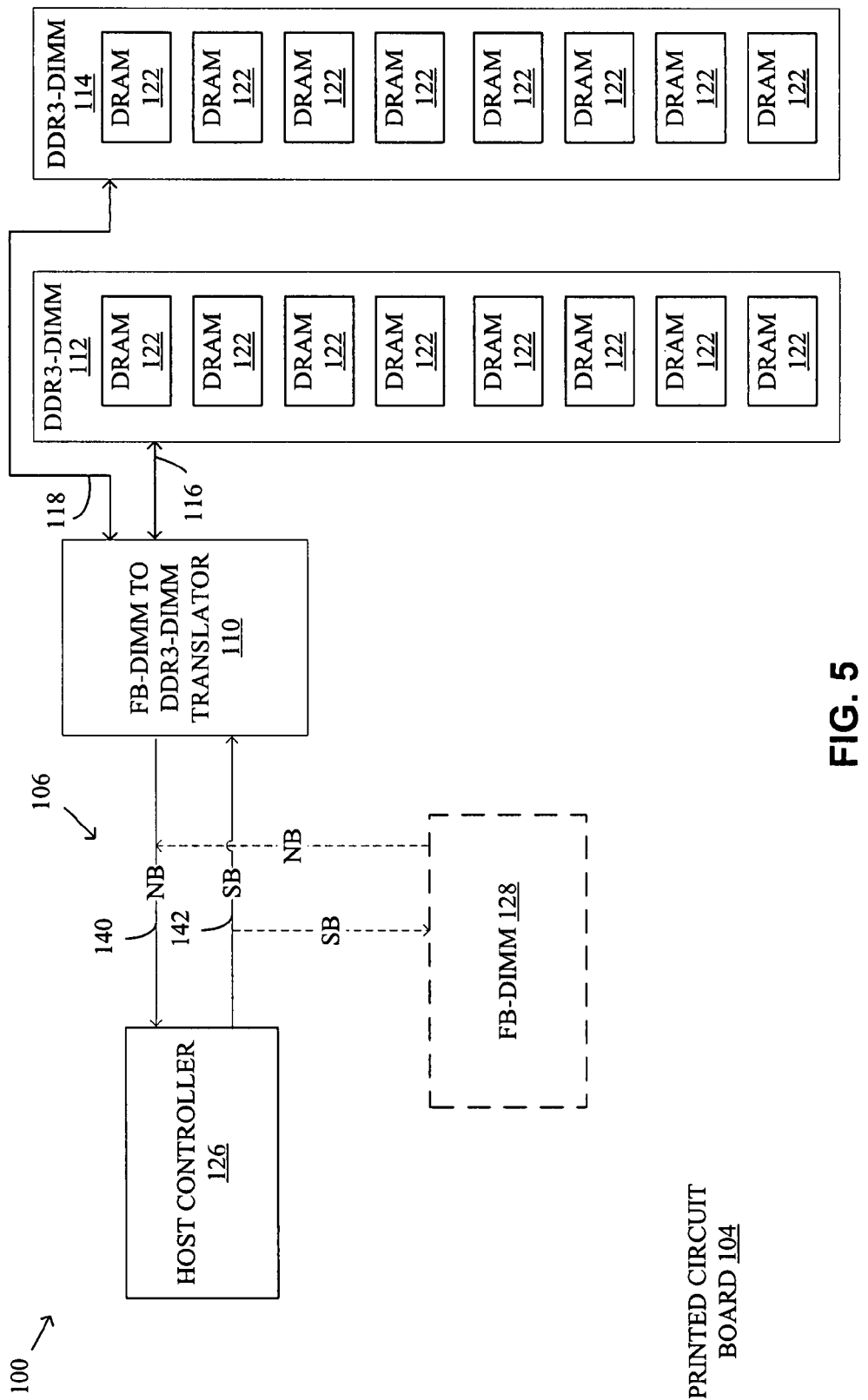
FIG. 5 is another implementation of the apparatus of FIG. 1 that comprises the PCB, one or more serial protocol busses, one or more parallel protocol memory modules, and one or more parallel protocol busses.

Turning to FIG. 5, another implementation of the apparatus 100 in an example comprises the PCB 104, one or more serial protocol busses 106, one or more parallel protocol memory modules 112, 114, 602 (FIG. 6), 604 (FIG. 6), 802 (FIG. 6), 804 (FIG. 6), 806 (FIG. 6), 808 (FIG. 6), and one or more parallel protocol busses 116, 118.

Figure 4:
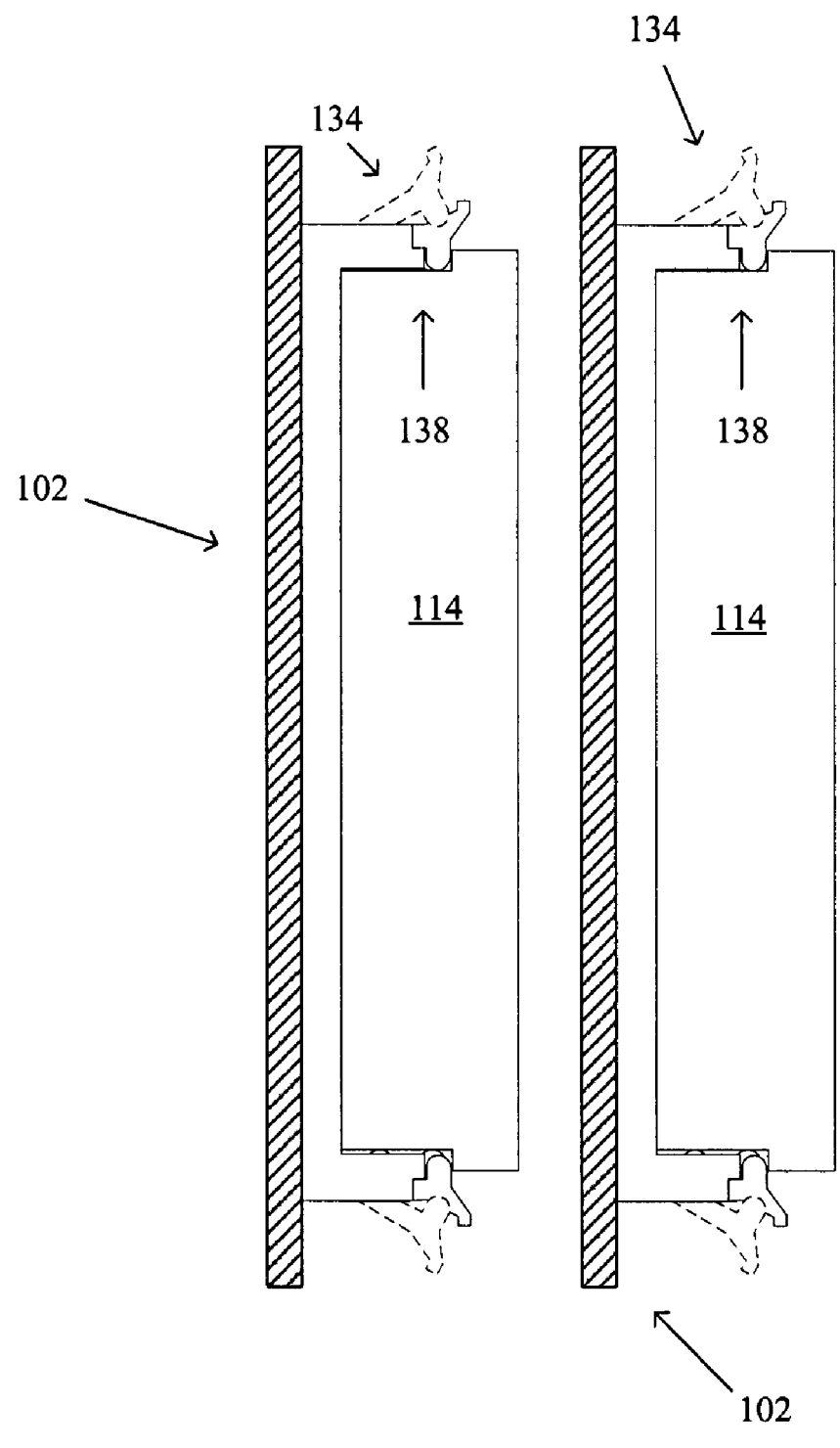
FIG. 4 is a top, partial representation of two riser cards and two parallel protocol memory modules of the implementation of the apparatus of FIG. 3.
Figure 6:
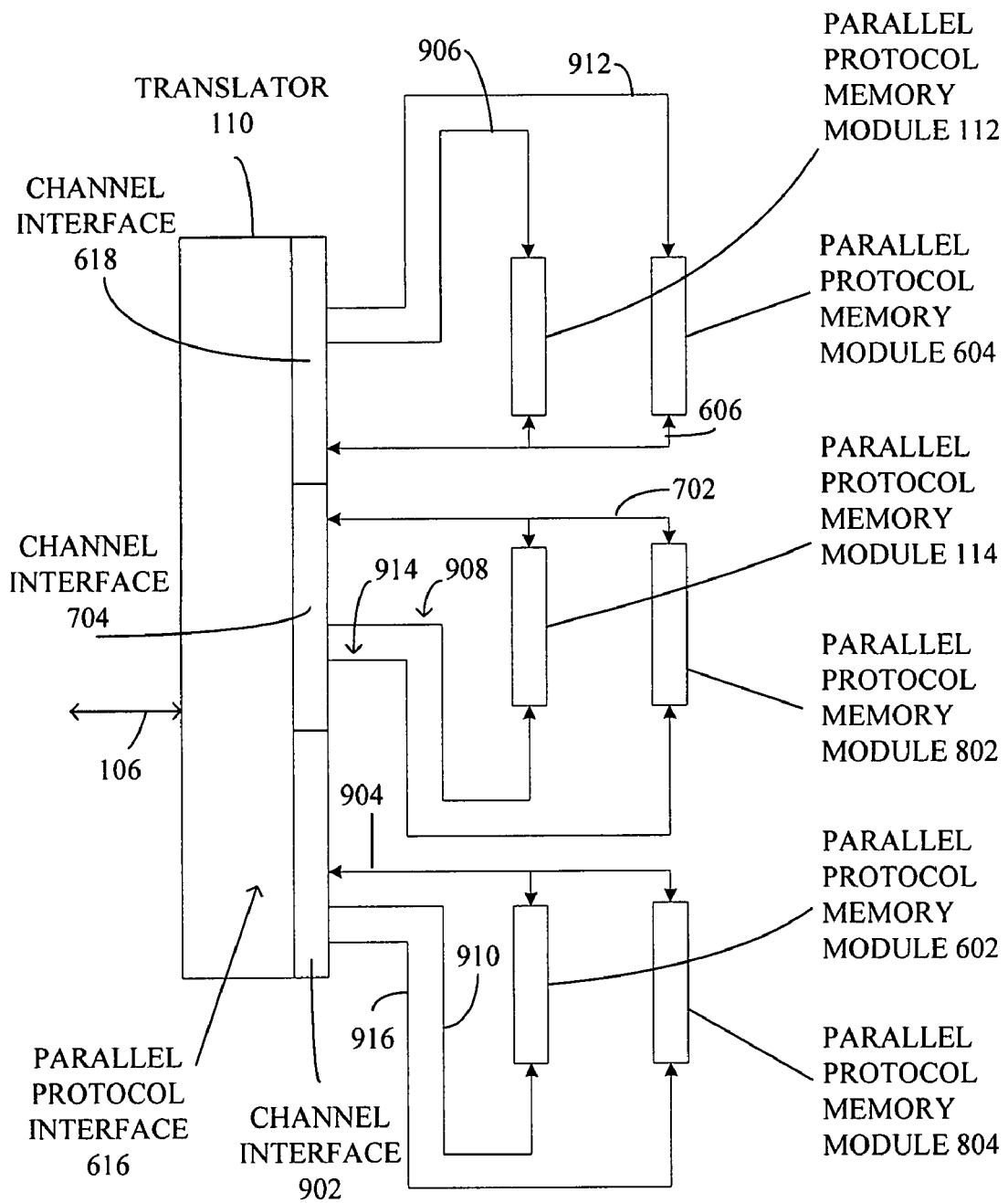
FIG. 6 is a representation of a translator and six parallel protocol memory modules of an implementation of the apparatus of FIG. 1, and illustrates three exemplary channel interfaces of the translator.
Figure 8:
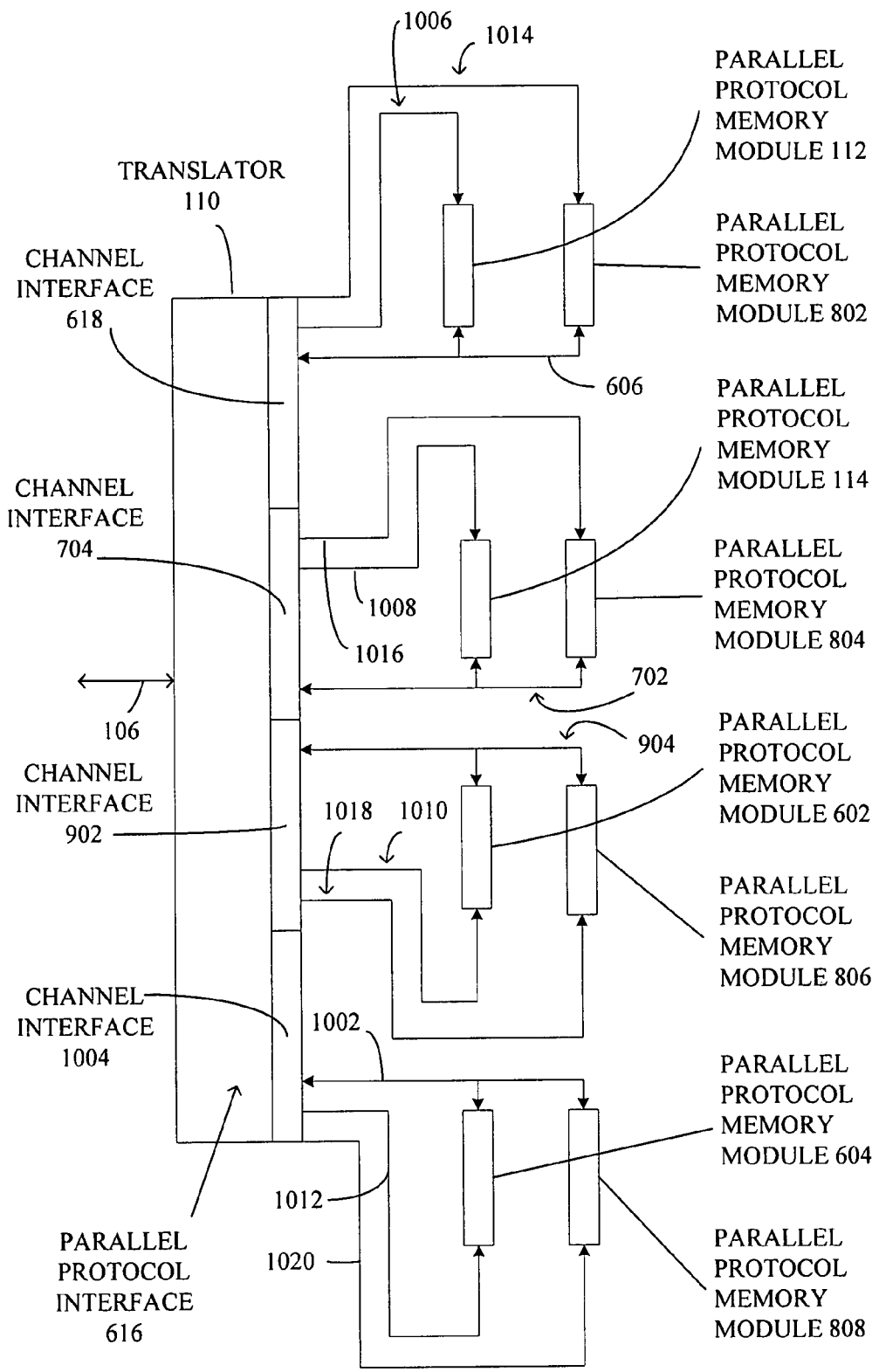
FIG. 8 is a representation of a translator and eight parallel protocol memory modules of an implementation of the apparatus of FIG. 1, and illustrates four exemplary channel interfaces of the translator.

Referring to FIG. 1, the riser card 102 in an example comprises a serial protocol interface 108, a translator 110, and one or more parallel protocol connectors and/or interfaces 132, 134 (FIGS. 1 and 4). As discussed herein with reference to FIG. 2, the riser card 102 in an example optionally comprises a connector 202 and/or one or more voltage regulator modules 204. The translator 110 in an example comprises an exemplary implementation of an algorithm, procedure, program, process, mechanism, engine, model, coordinator, module, application, code, and/or logic. The translator 110 in an example comprises a parallel protocol interface 616 (FIG. 6). An exemplary parallel protocol interface 616 comprises one or more channel interfaces 618 (FIG. 6), 704 (FIG. 6), 902 (FIG. 6), 1004 (FIG. 8).

The parallel protocol memory modules 112, 114, 602 (FIG. 6), 604 (FIG. 6), 802 (FIG. 6), 804 (FIG. 6), 806 (FIG. 6), 808 (FIG. 6) in an example comprise respective parallel protocol connectors and/or interfaces 136, 138 (FIGS. 1 and 4) and a plurality of parallel memory devices 122. For example, the parallel protocol memory module 112, 114, 602 (FIG. 6), 604 (FIG. 6), 802 (FIG. 6), 804 (FIG. 6), 806 (FIG. 6), 808 (FIG. 6) comprises eight, nine, eighteen parallel, and/or any selected and/or desired number of memory devices 122. Exemplary numbers of instances of the parallel protocol memory modules 112, 114, 602 (FIG. 6), 604 (FIG. 6), 802 (FIG. 6), 804 (FIG. 6), 806 (FIG. 6), 808 (FIG. 6) on an exemplary riser card 102 comprise any selected and/or desirable number, for example, two, four, eight, or sixteen parallel protocol memory modules 112, 114, 602 (FIG. 6), 604 (FIG. 6), 802 (FIG. 6), 804 (FIG. 6), 806 (FIG. 6), 808 (FIG. 6). For explanatory purposes, FIGS. 1-5 illustrate an exemplary implementation that comprises two parallel protocol memory modules 112, 114 on each riser card 102. As will be appreciated by those skilled in the art, an exemplary riser card 102 comprises more than two parallel protocol memory modules 112, 114, 602 (FIG. 6), 604 (FIG. 6), 802 (FIG. 6), 804 (FIG. 6), 806 (FIG. 6), 808 (FIG. 6). Exemplary parallel protocol memory modules 112, 114, 602 (FIG. 6), 604 (FIG. 6), 802 (FIG. 6), 804 (FIG. 6), 806 (FIG. 6), 808 (FIG. 6) comprise registered and/or unbuffered DIMMs, for example DDR3 DIMMs. An exemplary parallel memory device 122 comprises a dynamic random access memory (DRAM). The riser card 102 and the parallel protocol memory modules 112, 114, 602 (FIG. 6), 604 (FIG. 6), 802 (FIG. 6), 804 (FIG. 6), 806 (FIG. 6), 808 (FIG. 6) in an example serve to take a place of, substitute for, and/or provide an upgrade from a serial protocol memory module 128 such as a fully buffered dual in-line memory module (FB-DIMM, FBDIMM, and/or FBD). The serial protocol memory module 128 in an example comprises an interface 130, for example, that comprises an Advanced Memory Buffer (AMB).

Referring to FIG. 5, the translator 110, the parallel protocol memory modules 112, 114, 602 (FIG. 6), 604 (FIG. 6), 802 (FIG. 6), 804 (FIG. 6), 806 (FIG. 6), 808 (FIG. 6), and the one or more parallel protocol busses 116, 118 in an example serve to take a place of and/or substitute for the serial protocol memory module 128.

Referring to FIG. 1, the PCB 104 in an example comprises a serial protocol interface 124 and a memory controller and/or host controller 126. The serial protocol interfaces 108, 124, 130 in an example comprise FB-DIMM memory module connectors (FB-DIMM connectors). An exemplary FB-DIMM memory module connector as the serial protocol interface 108, 130 in an example comprises two hundred forty (240) pins and/or fingers that comply with standards of the JEDEC Solid State Technology Association (previously known as the Joint Electron Device Engineering Council; World Wide Web jedec.org).

The pins of an exemplary interface 108 are vertical and/or orthogonal. The pins of another exemplary interface 108 are angled and/or oblique. The serial protocol interface 108 in an example comprises gold pins that fit directly into an FB-DIMM memory module connector and/or FB-DIMM connector as the parallel protocol interface 124. An exemplary the FB-DIMM memory module connector as the serial protocol interface 124 comprises slots and/or holes that receive, engage, mesh, couple, connect, and/or mate with pins as an exemplary interface 108. The riser card 102 in an example fits directly into the FB-DIMM connector as the serial protocol interface 124. An edge of the riser card 102 in an example comprises gold fingers and/or pins that allow the riser card 102 to plug directly into the FB-DIMM memory module connector as the serial protocol interface 124. As discussed herein with reference to FIG. 2, the riser card 102 in an example comprises notches 206, 208 at both ends to allow the riser card 102 to be accommodated by end latches 308 (FIG. 3), for example, of a standard FB-DIMM memory module connector as an exemplary interface 124.

The bus 106 as an FB-DIMM bus in an example comprises a northbound (NB) path 140 and a southbound (SB) path 142. An exemplary northbound path 140 comprises fourteen (14) bit (binary digit) lanes carrying read data from memory such as the parallel protocol memory module 112, 114, 602 (FIG. 6), 604 (FIG. 6), 802 (FIG. 8), 804 (FIG. 8), 806 (FIG. 8), 808 (FIG. 8) to a processor such as the host controller 126. An exemplary southbound path 142 comprises ten (10) southbound (SB) bit lanes carrying commands and write data from the processor such as the host controller 126 to memory such as the parallel protocol memory module 112, 114, 602 (FIG. 6), 604 (FIG. 6), 802 (FIG. 8), 804 (FIG. 8), 806 (FIG. 8), 808 (FIG. 8).

An exemplary parallel protocol bus 116, 118 comprises a Double Data Rate (DDR) bus, for example, a DDR3 bus. The parallel protocol busses 116, 118 in an example comprise one or more data and/or strobe busses and one or more control and/or command busses, for example, data busses 606 (FIG. 6), 702 (FIG. 6), 904 (FIG. 6), 1002 (FIG. 8) and control busses 906 (FIG. 6), 908 (FIG. 6), 910 (FIG. 6), 912 (FIG. 6), 914 (FIG. 6), 916 (FIG. 6), 1006 (FIG. 8), 1008 (FIG. 8), 1010 (FIG. 8), 1012 (FIG. 8), 1014 (FIG. 8), 1016 (FIG. 8), 1018 (FIG. 8), 1020 (FIG. 8).

To allow employment of one or more DDR3 DIMMs as one or more parallel protocol memory modules 112, 114, 602 (FIG. 6), 604 (FIG. 6), 802 (FIG. 6), 804 (FIG. 6), 806 (FIG. 6), 808 (FIG. 6) on a computer system and/or PCB 104 with an existing FB-DIMM connector as the serial protocol interface 124 in an example a user need only plug in riser card 102 into the FB-DIMM connector as the serial protocol interface 124 and install DDR3 SDRAM (Synchronous Dynamic Random Access Memory) DIMMs as the parallel protocol memory modules 112, 114, 602 (FIG. 6), 604 (FIG. 6), 802 (FIG. 6), 804 (FIG. 6), 806 (FIG. 6), 808 (FIG. 6) at parallel protocol interface 132, 134 on the riser card 102. For example, to allow employment of one or more DDR3 DIMMs as one or more parallel protocol memory modules 112, 114, 602 (FIG. 6), 604 (FIG. 6), 802 (FIG. 6), 804 (FIG. 6), 806 (FIG. 6), 808 (FIG. 6) in an example a user need only replace an FB-DIMM as the serial protocol memory module 128 with the riser card 102, and have the DDR3 SDRAM DIMMs as the parallel protocol memory modules 112, 114, 602 (FIG. 6), 604 (FIG. 6), 802 (FIG. 6), 804 (FIG. 6), 806 (FIG. 6), 808 (FIG. 6) coupled with the riser card 102. To allow employment of an FB-DIMM as the serial protocol memory module 128 in an example a user need only replace the riser card 102 with the FB-DIMM as the serial protocol memory module 128.

The FB-DIMM to DDR3 translator IC as the translator 110 in an example receives commands and write data from the host controller 126 and sends read data back to the host controller 126 using the FB-DIMM protocol as a serial memory protocol. The FB-DIMM to DDR3 translator IC as the translator 110 in an example translates the FB-DIMM protocol as the serial memory protocol to DDR protocol as a parallel memory protocol to send transfer commands and read/write data to the DDR3 DIMMs as the parallel protocol memory modules 112, 114, 602 (FIG. 6), 604 (FIG. 6), 802 (FIG. 6), 804 (FIG. 6), 806 (FIG. 6), 808 (FIG. 6). The translator 110 in an example drives one or more DDR busses as the one or more parallel protocol busses 116, 118.

Figure 2:
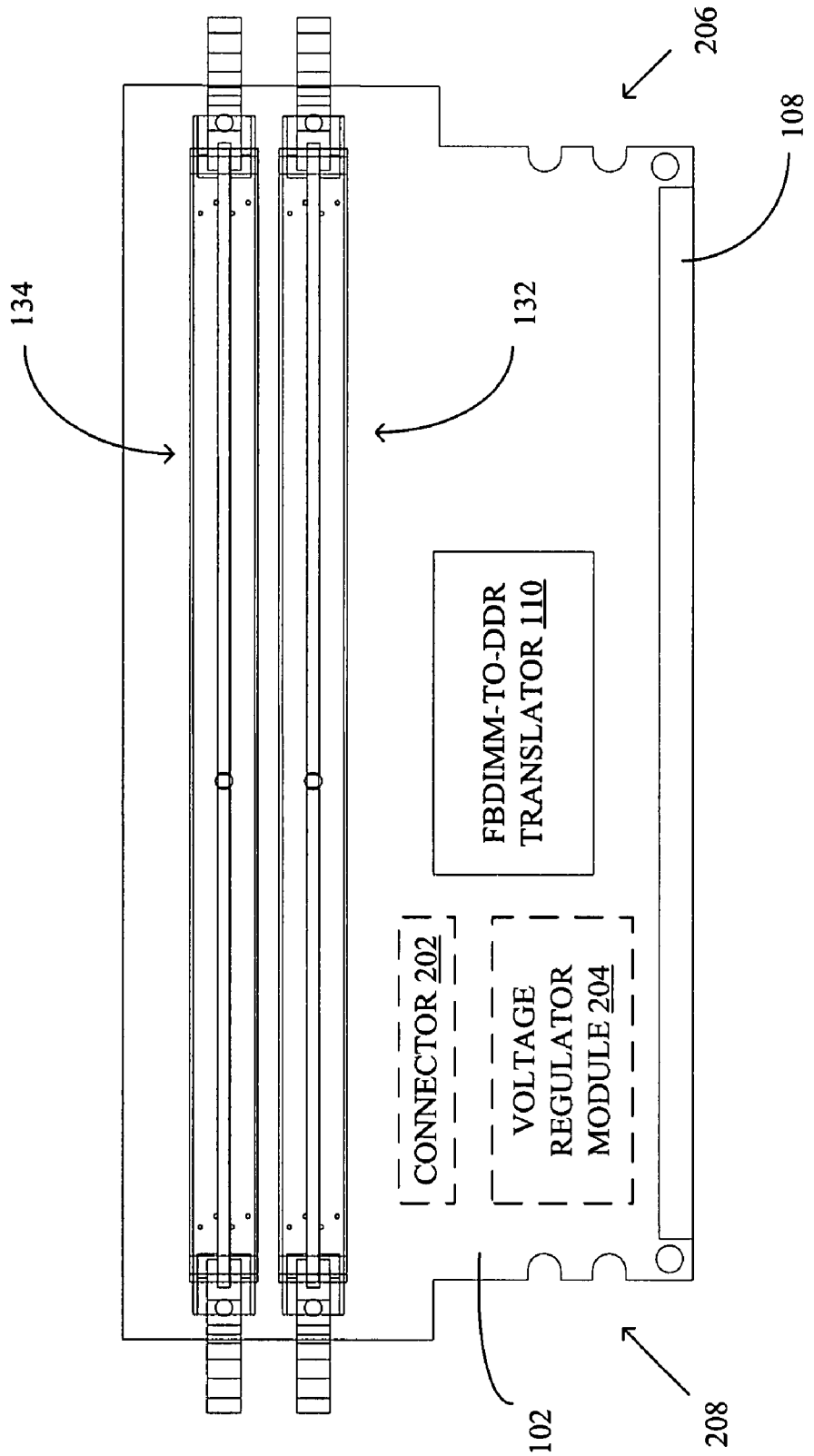
FIG. 2 is an enlarged, side representation of a riser card of an implementation of the apparatus of FIG. 1.

Turning to FIG. 2, the riser card 102 in an example comprises notches 206, 208 at both ends to allow the riser card 102 to be accommodated by end latches (not shown) of a standard FB-DIMM memory module connector as an exemplary interface 124. The riser card 102 in an example optionally comprises a connector 202 and/or a voltage regulator module 204. The connector 202 in an example receives and/or couples with a flying lead cable (not shown) to deliver additional power to the riser card 102, for example, to the voltage regulator module 204. An exemplary connector 202 is locatable at any desirable, selected, and/or convenient place on the riser card 102. The voltage regulator module 204 in an example is locatable on the card 102 such as to provide additional, extra, and/or sufficient power to the components onboard and/or connected with the riser card 102. An exemplary voltage regulator module 204 serves to generate component and/or bus voltages.

Figure 3:
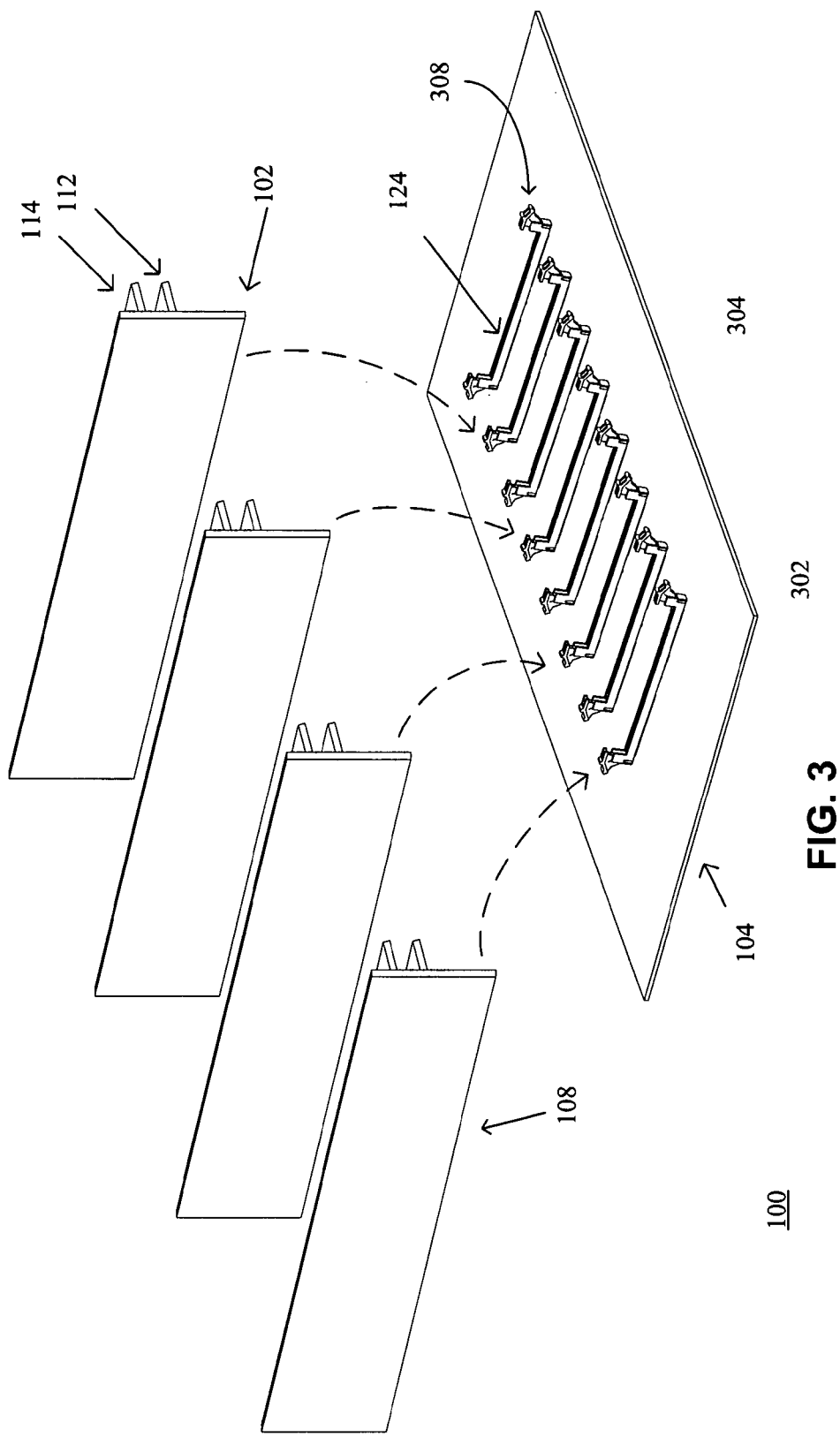
FIG. 3 is a perspective, cutaway, partial, exploded representation of a plurality of riser cards, a plurality of parallel protocol memory modules, and the PCB of an implementation of the apparatus of FIG. 1, and illustrates an exemplary vertical and/or orthogonal arrangement of the parallel protocol memory modules.

Turning to FIG. 3, the serial protocol interfaces 108 of a plurality of riser cards 102 in an example are inserted directly into a respective plurality of FB-DIMM connectors as the serial protocol interfaces 124 on the PCB 104. Referring to FIGS. 1, 3, and 4, DDR3 SDRAM memory as parallel protocol memory modules 112, 114, 602 (FIG. 6), 604 (FIG. 6), 802 (FIG. 6), 804 (FIG. 6), 806 (FIG. 6), 808 (FIG. 6) in an example have respective interfaces 136, 138 inserted on respective DDR3 DIMM connectors as the parallel protocol interfaces 132, 134 of the riser card 102. The PCB 102 in an example is embedded with FB-DIMM memory technology as a serial memory protocol implementation such as through employment of the host controller 126 and the serial protocol interface 124.

Referring to FIG. 4, an exemplary interface 132 comprises a latch that pivots into a holding gap as an exemplary interface 136. An exemplary latch as the interface 132 comprises a standard DIMM connector and/or socket latch. Referring to FIGS. 1 through 4, exemplary interfaces 132, 134, 136, 138 are vertical and/or orthogonal. An exemplary DDR-DIMM interface as the interface 132, 134, 136, 138 in an example comprises connection of two hundred forty (240) pins and/or fingers that comply with standards of the JEDEC Solid State Technology Association (previously known as the Joint Electron Device Engineering Council; World Wide Web jedec.org).

Figure 7:
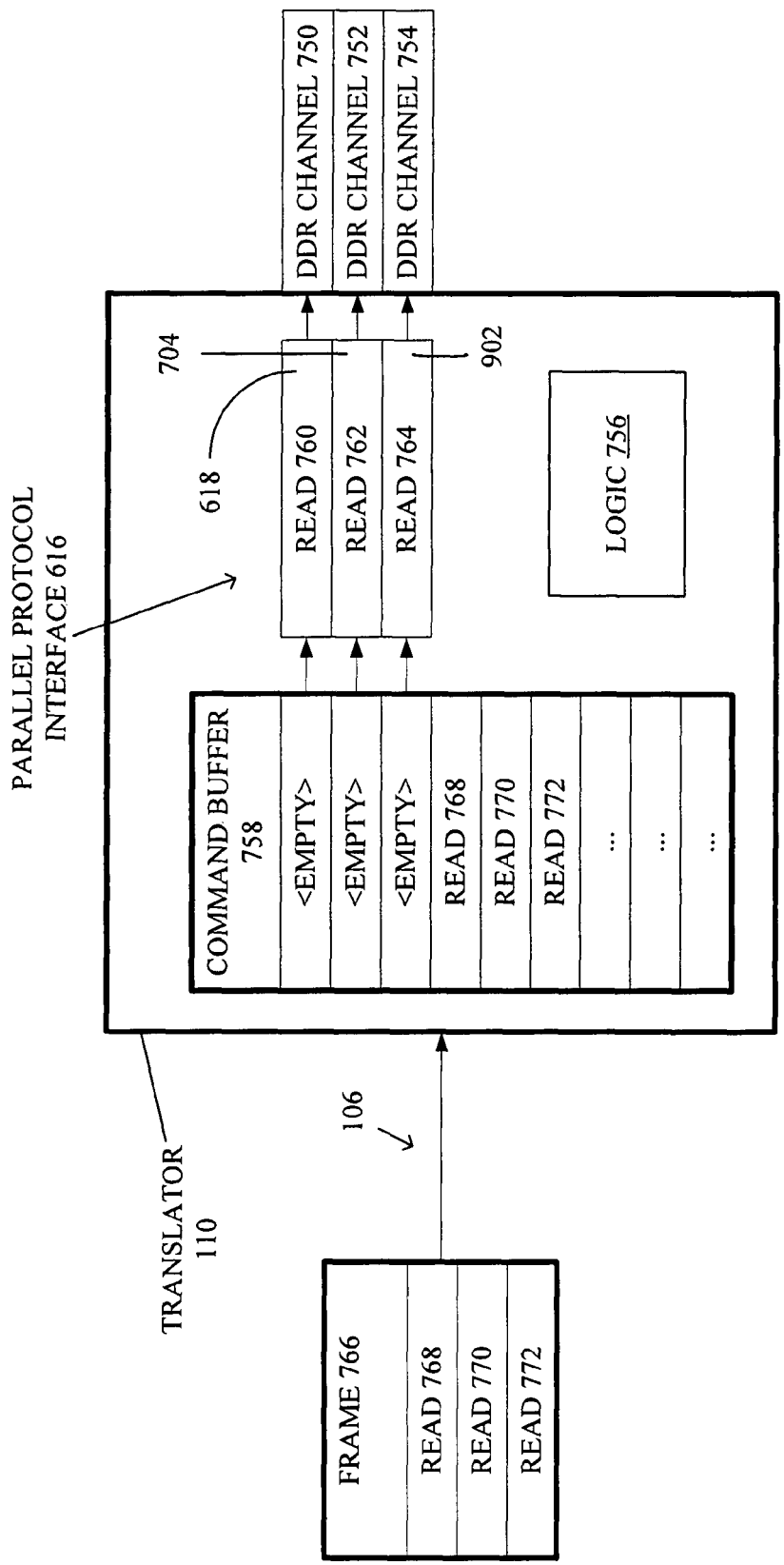
FIG. 7 is a representation of an exemplary frame of commands carried over a serial protocol bus to the translator of an implementation of the apparatus FIG. 6, and illustrates logic of the translator that evaluates the commands to three channels.

Referring to FIGS. 6 and 7, the parallel protocol interface 616 of the translator 110 in an example comprises three channel interfaces, for example, channel interface 618, channel interface 704, and channel interface 902 to respective channels 750, 752, 754. The channels 750, 752, 754 in an example comprise three respective DDR channels. The parallel protocol interface 616 in an example comprises three DDR channel outputs from the channel interfaces 618, 704, 902, for example, with four (4) ranks on each channel 750, 752, 754 for an exemplary total of twelve (12) ranks. An exemplary implementation employs two-rank parallel memory modules as the parallel protocol memory modules 112, 114, 602, 604, 802, 804.

The translator 110 in an example comprises logic 756 and command-memory, storage, and/or buffer 758. The logic 756 of the translator 110 in an example comprises an exemplary implementation of an algorithm, procedure, program, process, mechanism, engine, model, coordinator, module, application, code, and/or logic. The logic 756 in an example evaluates, reviews, identifies, associates, coordinates, and/or aligns READ commands 760, 762, 764 received into the command buffer 758 in a frame 766 sent over the serial protocol bus 106 from the host controller 126 (FIG. 1, 5). An exemplary evaluation, review, and/or consideration of the READ commands 760, 762, 764 by the logic 756 evaluates, reviews, identifies, associates, coordinates, and/or aligns the READ commands 760, 762, 764 with the channel interfaces 618, 704, 902, respectively, for communication over the respective channels 750, 752, 754. The translator 110 in an example executes three simultaneous, substantially simultaneous, and/or pipelined commands as the READ commands 760, 762, 764 if the commands correspond, align, and/or evaluate to three respective channels 750, 752, 754 for communication from the three channel interfaces 618, 704, 902, respectively, for example, to registered and/or unbuffered DIMMs as exemplary parallel protocol memory modules 112, 114, 602, 604, 802, 804 on the DDR channels. The translator 110 in an example processes three back-to-back-to-back READ commands 760, 762, 764 in a streamlined, pipelined, and/or non-penalized performance fashion.

In an exemplary next event, the logic 756 in an example evaluates, reviews, identifies, associates, coordinates, and/or aligns READ commands 768, 770, 772 received into the command buffer 758 in a frame 766 sent over the serial protocol bus 106 from the host controller 126. If an exemplary evaluation, review, and/or consideration of the READ commands 768, 770, 772 by the logic 756 evaluates, identifies, associates, coordinates, and/or aligns the READ commands 768, 770, 772 with the channel interfaces 618, 704, 902, respectively, for communication over the respective channels 750, 752, 754 then in an example the translator 110 executes three additional, later, and/or subsequent simultaneous, substantially simultaneous, and/or pipelined commands as the READ commands 768, 770, 772. The set of READ commands 768, 770, 772 in an example may immediately follow the set of READ commands 760, 762, 764. The logic 756 in an example evaluates, reviews, identifies, associates, coordinates, and/or aligns the READ commands 768, 770, 772 with three respective channels 750, 752, 754 for communication from the three channel interfaces 618, 704, 902, respectively, for example, to registered and/or unbuffered DIMMs as exemplary parallel protocol memory modules 112, 114, 602, 604, 802, 804 on the DDR channels. The translator 110 in an example processes three back-to-back-to-back READ commands 768, 770, 772 in a streamlined, pipelined, and/or non-penalized performance fashion.

Figure 9:
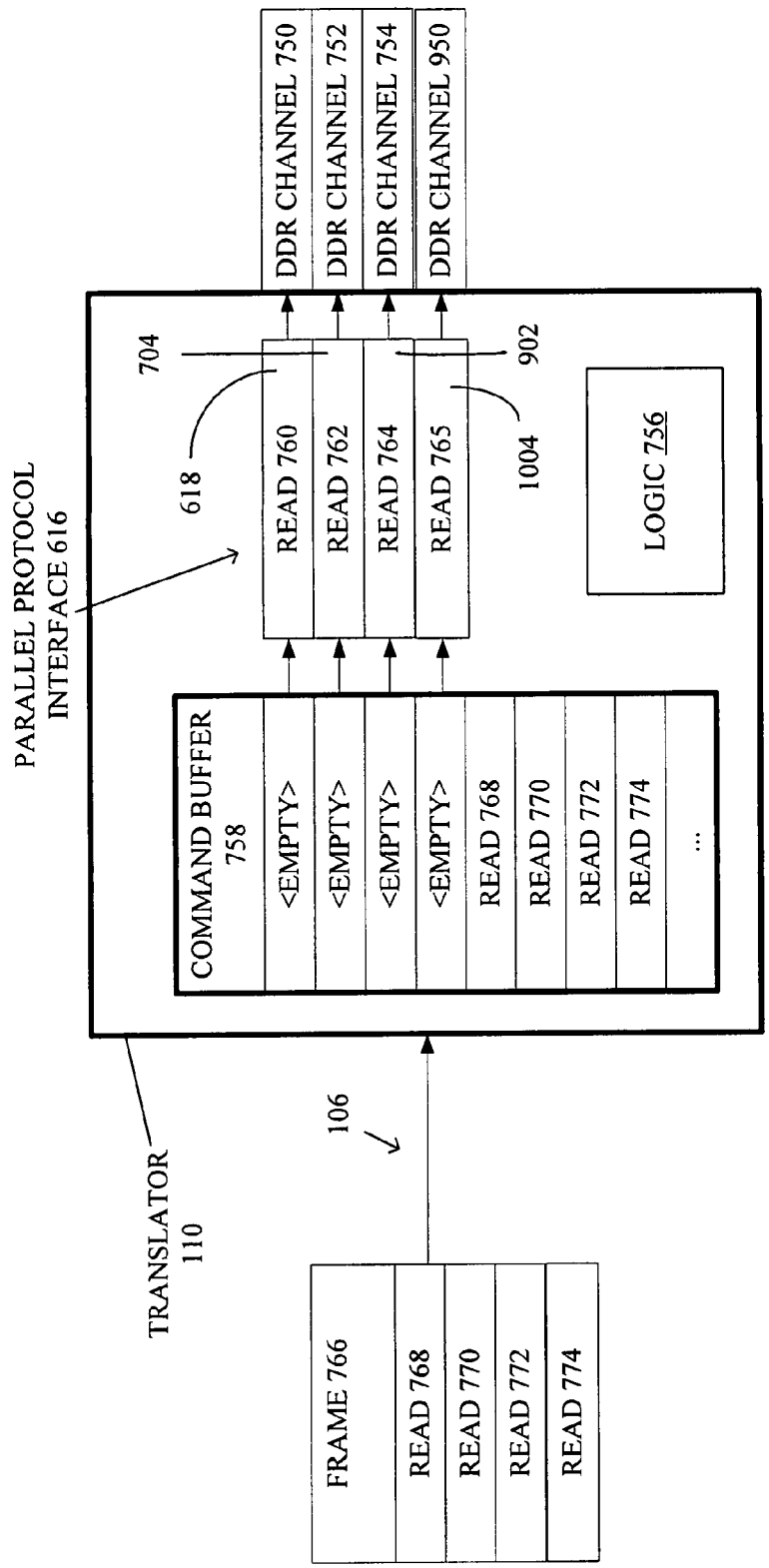
FIG. 9 is a representation of an exemplary frame of commands carried over a serial protocol bus to the translator of an implementation of the apparatus FIG. 8, and illustrates logic of the translator that evaluates the commands to four channels.

Referring to FIGS. 8 and 9, the parallel protocol interface 616 of the translator 110 in an example comprises four channel interfaces, for example, channel interface 618, channel interface 704, channel interface 902, and channel interface 1004 to respective channels 750, 752, 754, 950. The channels 750, 752, 754, 950 in an example comprise four respective DDR channels. The parallel protocol interface 616 in an example comprises four DDR channel outputs from the channel interfaces 618, 704, 902, 1004, for example, with four (4) ranks on each channel 750, 752, 754, 950 for an exemplary total of sixteen (16) ranks. An exemplary implementation employs two-rank parallel memory modules as the parallel protocol memory modules 112, 114, 602, 604, 802, 804, 806, 808.

The logic 756 in an example evaluates, reviews, identifies, associates, coordinates, and/or aligns READ commands 760, 762, 764, 765 received into the command buffer 758 in a frame 766 sent over the serial protocol bus 106 from the host controller 126 (FIG. 1, 5). An exemplary evaluation of the READ commands 760, 762, 764, 765 by the logic 756 evaluates, reviews, identifies, associates, coordinates, and/or aligns the READ commands 760, 762, 764, 765 with the channel interfaces 618, 704, 902, 1004, respectively, for communication over the respective channels 750, 752, 754, 950. The translator 110 in an example executes four simultaneous, substantially simultaneous, and/or pipelined commands as the READ commands 760, 762, 764, 765 if the commands evaluate to four respective channels 750, 752, 754, 950 for communication from the four channel interfaces 618, 704, 902, 1004 respectively, for example, to registered and/or unbuffered DIMMs as exemplary parallel protocol memory modules 112, 114, 602, 604, 802, 804, 806, 808 on the DDR channels. The translator 110 in an example processes four back-to-back-to-back-to-back READ commands 760, 762, 764, 765 in a streamlined, pipelined, and/or non-penalized performance fashion.

In an exemplary next event, the logic 756 in an example evaluates READ commands 768, 770, 772, 774 received into the command buffer 758 in a frame 766 sent over the serial protocol bus 106 from the host controller 126. If an exemplary evaluation of the READ commands 768, 770, 772, 774 by the logic 756 evaluates, reviews, identifies, associates, coordinates, and/or aligns the READ commands 768, 770, 772, 774 with the channel interfaces 618, 704, 902, 1004, respectively, for communication over the respective channels 750, 752, 754, 950 then in an example the translator 110 executes four additional, later, and/or subsequent simultaneous, substantially simultaneous, and/or pipelined commands as the READ commands 768, 770, 772, 774. The set of READ commands 768, 770, 772, 774 in an example may immediately follow the set of READ commands 760, 762, 764, 765. The logic 756 in an example evaluates, reviews, identifies, associates, coordinates, and/or aligns the READ commands 768, 770, 772, 774 with four respective channels 750, 752, 754, 950 for communication from the four channel interfaces 618, 704, 902, 1004 respectively, for example, to registered and/or unbuffered DIMMs as exemplary parallel protocol memory modules 112, 114, 602, 604, 802, 804, 806, 808 on the DDR channels. The translator 110 in an example processes four back-to-back-to-back-to-back READ commands 768, 770, 772, 774 in a streamlined, pipelined, and/or non-penalized performance fashion.

Figure 10:
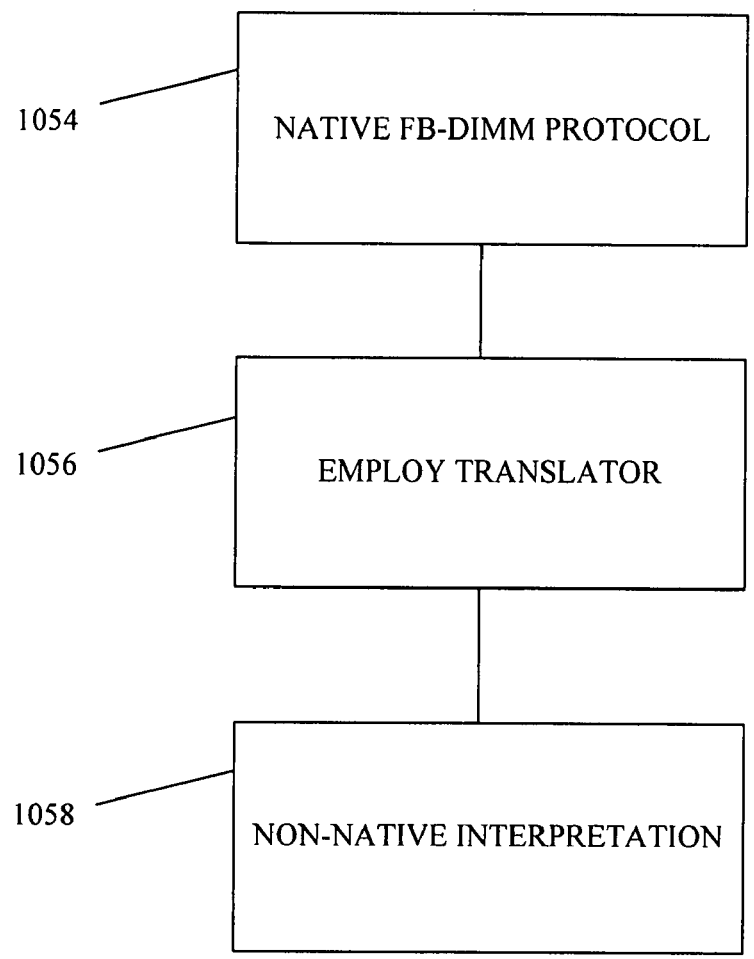
FIG. 10 is a representation of an exemplary logic flow for making substantially transparent an employment of a translator to a native FB-DIMM protocol host controller of an implementation of the apparatus of FIG. 1.

An illustrative description of an exemplary operation of an implementation of the apparatus 100 is presented, for explanatory purposes. FIG. 10 is a representation of an exemplary logic flow 1052 for making substantially transparent an employment of the translator 110 to a native FB-DIMM protocol host controller as the host controller 126. The logic flow 1052 in an example is performed by a user, a consumer, an on-site service technician and/or provider, and/or an in-shop service technician and/or provider. STEP 1054 in an example proceeds to accommodate a native FB-DIMM protocol. STEP 1056 employs a translator 110. STEP 1058 applies a non-native interpretation to the native FB-DIMM protocol. There is made substantially transparent to a native fully buffered dual in-line memory module protocol (native FB-DIMM protocol) host controller 126 an employment of a translator 110 that processes three or more READ commands received under the native FB-DIMM protocol and communicates with a respective three or more parallel protocol memory module channels that comprise a plurality of double data rate registered and/or unbuffered dual in-line memory modules (DDR registered and/or unbuffered DIMMs) 112, 114, 602, 604, 802, 804, 806, 808.

An exemplary implementation comprises a translator that communicatively interconnects a serial protocol bus that follows a native fully buffered dual in-line memory module protocol (native FB-DIMM protocol) and three or more parallel protocol memory module channels that comprise a plurality of double data rate registered and/or unbuffered dual in-line memory modules (DDR registered and/or unbuffered DIMMs).

The translator comprises a respective three or more channel interfaces to the three or more parallel protocol memory module channels that comprise the plurality of DDR registered and/or unbuffered DIMMs. The three or more channel interfaces comprise three DDR channel outputs to the three or more parallel protocol memory module channels that comprise the plurality of DDR registered and/or unbuffered DIMMs. The three or more parallel protocol memory module channels comprise four or more parallel protocol memory module channels that comprise the plurality of DDR registered and/or unbuffered DIMMs. The translator comprises a respective four or more channel interfaces to the four or more parallel protocol memory module channels that comprise the plurality of DDR registered and/or unbuffered DIMMs. The four or more channel interfaces comprise four DDR channel outputs to the four or more parallel protocol memory module channels that comprise the plurality of DDR registered and/or unbuffered DIMMs.

The translator evaluates READ commands received under the native FB-DIMM protocol to make a determination of up to three of the READ commands that the translator substantially simultaneously sends over a respective up to three of the three or more parallel protocol memory module channels that comprise the plurality of DDR registered and/or unbuffered DIMMs. The translator comprises three DDR channel outputs to the three or more parallel protocol memory module channels that comprise the plurality of DDR registered and/or unbuffered DIMMs. The translator evaluates the READ commands received under the native FB-DIMM protocol to make a determination of three of the READ commands that the translator substantially simultaneously sends over the three DDR channel outputs to the three or more parallel protocol memory module channels that comprise the plurality of DDR registered and/or unbuffered DIMMs. The translator processes three back-to-back-to-back READ commands received under the native FB-DIMM protocol and substantially simultaneously sends the three back-to-back-to-back READ commands over a respective three of the three or more parallel protocol memory module channels that comprise the plurality of DDR registered and/or unbuffered DIMMs.

The three or more parallel protocol memory module channels comprise four or more parallel protocol memory module channels that comprise the plurality of DDR registered and/or unbuffered DIMMs. The translator evaluates READ commands received under the native FB-DIMM protocol to make a determination of up to four of the READ commands that the translator substantially simultaneously sends over a respective up to four of the four or more parallel protocol memory module channels. The translator comprises four DDR channel outputs to the four or more parallel protocol memory module channels that comprise the plurality of DDR registered and/or unbuffered DIMMs. The translator evaluates the READ commands received under the native FB-DIMM protocol to make a determination of four of the READ commands that the translator substantially simultaneously sends over the four DDR channel outputs to the four or more parallel protocol memory module channels that comprise the plurality of DDR registered and/or unbuffered DIMMs.

The three or more parallel protocol memory module channels comprise four parallel protocol memory module channels that comprise the plurality of DDR registered and/or unbuffered DIMMs. The translator processes four back-to-back-to-back-to-back READ commands received under the native FB-DIMM protocol and substantially simultaneously sends the four back-to-back-to-back-to-back READ commands over the four parallel protocol memory module channels, respectively. The three or more parallel protocol memory module channels conform to a double data rate synchronous dynamic random access memory (DDR SDRAM) protocol. The translator communicatively interconnects the serial protocol bus that follows the native FB-DIMM protocol and the three or more parallel protocol memory module channels that conform to the DDR SDRAM protocol and comprise the plurality of DDR registered and/or unbuffered DIMMs.

The three or more parallel protocol memory module channels comprise a respective three or more DDR channels. The translator pipelines three or more READ commands received over the serial protocol bus that follows the native FB-DIMM protocol on a respective three or more DDR busses in the three or more DDR channels, respectively.

The native FB-DIMM protocol is employed within a printed circuit board (PCB) that comprises a serial connection external interface. The translator through the serial connection external interface of the PCB and over the serial protocol bus and the three or more parallel protocol memory module channels communicates between the native FB-DIMM protocol within the PCB and a parallel memory protocol on and/or coupled through a riser card outside the PCB. The parallel memory protocol comprises a double data rate synchronous dynamic random access memory (DDR SDRAM) protocol on and/or coupled through the riser card outside the PCB. The translator through the serial connection external interface of the PCB and over the serial protocol bus and the three or more parallel protocol memory module channels communicates between the FB-DIMM protocol within the PCB and the DDR SDRAM protocol on and/or coupled through the riser card outside the PCB.

An exemplary implementation comprises a translator that substantially simultaneously sends three or more READ commands received under a native fully buffered dual in-line memory module protocol (native FB-DIMM protocol) over a respective three or more parallel protocol memory module channels that comprise a plurality of double data rate registered and/or unbuffered dual in-line memory modules (DDR registered and/or unbuffered DIMMs).

The three or more parallel protocol memory module channels conform to a double data rate synchronous dynamic random access memory (DDR SDRAM) protocol. The translator communicates between the native FB-DIMM protocol and the DDR SDRAM protocol to substantially simultaneously send the three or more READ commands received under the native FB-DIMM protocol over the three or more parallel protocol memory module channels that conform to the DDR SDRAM protocol and comprise the plurality of DDR registered and/or unbuffered DIMMs.

The native FB-DIMM protocol is employed within a printed circuit board (PCB) that comprises a serial connection external interface. The three or more READ commands are received by the translator under the native FB-DIMM protocol within the PCB. The translator through the serial connection external interface of the PCB and over a serial protocol bus and the three or more parallel protocol memory module channels substantially simultaneously communicates the three or more READ commands received under the native FB-DIMM protocol within the PCB to a parallel memory protocol on and/or coupled through a riser card outside the PCB.

An exemplary approach makes substantially transparent to a native fully buffered dual in-line memory module protocol (native FB-DIMM protocol) host controller an employment of a translator that processes three or more READ commands received under the native FB-DIMM protocol and communicates with a respective three or more parallel protocol memory module channels that comprise a plurality of double data rate registered and/or unbuffered dual in-line memory modules (DDR registered and/or unbuffered DIMMs).

The three or more parallel protocol memory module channels conform to a double data rate synchronous dynamic random access memory (DDR SDRAM) protocol. There is made substantially transparent to the native FB-DIMM protocol host controller an employment of the translator to communicatively interconnect: a serial protocol bus that carries the three or more READ commands and follows the native FB-DIMM protocol; and the three or more parallel protocol memory module channels that conform to the DDR SDRAM protocol and comprise the plurality of DDR registered and/or unbuffered DIMMs.

An implementation of the apparatus 100 in an example comprises a plurality of components such as one or more of electronic components, chemical components, organic components, mechanical components, hardware components, optical components, and/or computer software components. A number of such components can be combined or divided in an implementation of the apparatus 100. In one or more exemplary implementations, one or more features described herein in connection with one or more components and/or one or more parts thereof are applicable and/or extendible analogously to one or more other instances of the particular component and/or other components in the apparatus 100. In one or more exemplary implementations, one or more features described herein in connection with one or more components and/or one or more parts thereof may be omitted from or modified in one or more other instances of the particular component and/or other components in the apparatus 100. An exemplary technical effect is one or more exemplary and/or desirable functions, approaches, and/or procedures. An exemplary component of an implementation of the apparatus 100 employs and/or comprises a set and/or series of computer instructions written in or implemented with any of a number of programming languages, as will be appreciated by those skilled in the art. An implementation of the apparatus 100 in an example comprises any (e.g., horizontal, oblique, or vertical) orientation, with the description and figures herein illustrating an exemplary orientation of an exemplary implementation of the apparatus 100, for explanatory purposes.

An implementation of the apparatus 100 in an example encompasses an article. The article comprises one or more computer-readable signal-bearing media. The article comprises means in the one or more media for one or more exemplary and/or desirable functions, approaches, and/or procedures.

An implementation of the apparatus 100 in an example employs one or more computer readable signal bearing media. A computer-readable signal-bearing medium in an example stores software, firmware and/or assembly language for performing one or more portions of one or more implementations. An example of a computer-readable signal bearing medium for an implementation of the apparatus 100 comprises a memory and/or recordable data storage medium of the riser card 102 and/or PCB 104. A computer-readable signal-bearing medium for an implementation of the apparatus 100 in an example comprises one or more of a magnetic, electrical, optical, biological, chemical, and/or atomic data storage medium. For example, an implementation of the computer-readable signal-bearing medium comprises one or more floppy disks, magnetic tapes, CDs, DVDs, hard disk drives, and/or electronic memory. In another example, an implementation of the computer-readable signal-bearing medium comprises a modulated carrier signal transmitted over a network comprising or coupled with an implementation of the apparatus 100, for instance, one or more of a telephone network, a local area network ("LAN"), a wide area network ("WAN"), the Internet, and/or a wireless network.

The steps or operations described herein are examples. There may be variations to these steps or operations without departing from the spirit of the invention. For example, the steps may be performed in a differing order, or steps may be added, deleted, or modified.

Although exemplary implementation of the invention has been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
a translator that communicatively interconnects a serial protocol bus that follows a native fully buffered dual in-line memory module protocol (native FB-DIMM protocol) and three or more parallel protocol memory module channels that comprise a plurality of double data rate registered and/or unbuffered dual in-line memory modules (DDR registered and/or unbuffered DIMMs),
wherein the three or more parallel protocol memory module channels conform to a double data rate synchronous dynamic random access memory (DDR SDRAM) protocol, and;
wherein the translator communicatively interconnects the serial protocol bus that follows the native FB-DIMM protocol and the three or more parallel protocol memory module channels that conform to the DDR SDRAM protocol and comprise the plurality of DDR registered and/or unbuffered DIMMs.

2. The apparatus of claim 1, wherein the translator comprises a respective three or more channel interfaces to the three or more parallel protocol memory module channels that comprise the plurality of DDR registered and/or unbuffered DIMMs.

3. The apparatus of claim 1, wherein the three or more parallel protocol memory module channels comprise four or more parallel protocol memory module channels that comprise the plurality of DDR registered and/or unbuffered DIMMs;
wherein the translator comprises a respective four or more channel interfaces to the four or more parallel protocol memory module channels that comprise the plurality of DDR registered and/or unbuffered DIMMs.

4. The apparatus of claim 1, wherein the translator evaluates READ commands received under the native FB-DIMM protocol to make a determination of up to three of the READ commands that the translator substantially simultaneously sends over a respective up to three of the three or more parallel protocol memory module channels that comprise the plurality of DDR registered and/or unbuffered DIMMs.

5. The apparatus of claim 1, wherein the translator processes three back-to-back-to-back READ commands received under the native FB-DIMM protocol and substantially simultaneously sends the three back-to-back-to-back READ commands over a respective three of the three or more parallel protocol memory module channels that comprise the plurality of DDR registered and/or unbuffered DIMMs.

6. The apparatus of claim 1, wherein the three or more parallel protocol memory module channels comprise four or more parallel protocol memory module channels that comprise the plurality of DDR registered and/or unbuffered DIMMs;
wherein the translator evaluates READ commands received under the native FB-DIMM protocol to make a determination of up to four of the READ commands that the translator substantially simultaneously sends over a respective up to four of the four or more parallel protocol memory module channels.

7. The apparatus of claim 1, wherein the three or more parallel protocol memory module channels comprise four parallel protocol memory module channels that comprise the plurality of DDR registered and/or unbuffered DIMMs;
wherein the translator processes four back-to-back-to-back-to-back READ commands received under the native FB-DIMM protocol and substantially simultaneously sends the four back-to-back-to-back-to-back READ commands over the four parallel protocol memory module channels, respectively.

8. The apparatus of claim 1, wherein the three or more parallel protocol memory module channels comprise a respective three or more DDR channels;
wherein the translator pipelines three or more READ commands received over the serial protocol bus that follows the native FB-DIMM protocol on a respective three or more DDR busses in the three or more DDR channels, respectively.

9. The apparatus of claim 1, wherein the native FB-DIMM protocol is employed within a printed circuit board (PCB) that comprises a serial connection external interface;
wherein the translator through the serial connection external interface of the PCB and over the serial protocol bus and the three or more parallel protocol memory module channels communicates between the native FB-DIMM protocol within the PCB and a parallel memory protocol on and/or coupled through a riser card outside the PCB.

10. The apparatus of claim 2, wherein the three or more channel interfaces comprise three DDR channel outputs to the three or more parallel protocol memory module channels that comprise the plurality of DDR registered and/or unbuffered DIMMs.

11. The apparatus of claim 3, wherein the four or more channel interfaces comprise four DDR channel outputs to the four or more parallel protocol memory module channels that comprise the plurality of DDR registered and/or unbuffered DIMMs.

12. The apparatus of claim 4, wherein the translator comprises three DDR channel outputs to the three or more parallel protocol memory module channels that comprise the plurality of DDR registered and/or unbuffered DIMMs;
wherein the translator evaluates the READ commands received under the native FB-DIMM protocol to make a determination of the three READ commands that the translator substantially simultaneously sends over the three DDR channel outputs to the three or more parallel protocol memory module channels that comprise the plurality of DDR registered and/or unbuffered DIMMs.

13. The apparatus of claim 6, wherein the translator comprises four DDR channel outputs to the four or more parallel protocol memory module channels that comprise the plurality of DDR registered and/or unbuffered DIMMs;
wherein the translator evaluates the READ commands received under the native FB-DIMM protocol to make a determination of the four READ commands that the translator substantially simultaneously sends over the four DDR channel outputs to the four or more parallel protocol memory module channels that comprise the plurality of DDR registered and/or unbuffered DIMMs.

14. The apparatus of claim 9, wherein the parallel memory protocol comprises a double data rate synchronous dynamic random access memory (DDR SDRAM) protocol on and/or coupled through the riser card outside the PCB, wherein the translator through the serial connection external interface of the PCB and over the serial protocol bus and the three or more parallel protocol memory module channels communicates between the FB-DIMM protocol within the PCB and the DDR SDRAM protocol on and/or coupled through the riser card outside the PCB.

15. An apparatus, comprising:
a translator that substantially simultaneously sends three or more READ commands received under a native fully buffered dual in-line memory module protocol (native FB-DIMM protocol) over a respective three or more parallel protocol memory module channels that comprise a plurality of double data rate registered and/or unbuffered dual in-line memory modules (DDR registered and/or unbuffered DIMMs), wherein the three or more parallel protocol memory module channels conform to a double data rate synchronous dynamic random access memory (DDR SDRAM) protocol; and the translator communicates between the native FB-DIMM protocol and the DDR SDRAM protocol to substantially simultaneously send the three or more READ commands received under the native FB-DIMM protocol over the three or more parallel protocol memory module channels that conform to the DDR SDRAM protocol and comprise the plurality of DDR registered and/or unbuffered DIMMs.

16. The apparatus of claim 15, wherein the native FB-DIMM protocol is employed within a printed circuit board (PCB) that comprises a serial connection external interface, wherein the three or more READ commands are received by the translator under the native FB-DIMM protocol within the PCB;

wherein the translator through the serial connection external interface of the PCB and over a serial protocol bus and the three or more parallel protocol memory module channels substantially simultaneously communicates the three or more READ commands received under the native FB-DIMM protocol within the PCB to a parallel memory protocol on and/or coupled through a riser card outside the PCB.

17. A method, comprising the step of:

making substantially transparent to a native fully buffered dual in-line memory module protocol (native FB-DIMM protocol) host controller an employment of a translator that processes three or more READ commands received under the native FB-DIMM protocol and communicatively interconnects a serial protocol bus with a respective three or more parallel protocol memory module channels that comprise a plurality of double data rate registered and/or unbuffered dual in-line memory modules (DDR registered and/or unbuffered DIMMs), wherein the three or more parallel protocol memory module channels conform to a double data rate synchronous dynamic random access memory (DDR SDRAM) protocol, and;

the translator communicatively interconnecting a serial protocol bus that follows the native FB-DIMM protocol and the three or more parallel protocol memory module channels that conform to the DDR SDRAM protocol and comprise the plurality of DDR registered and/or unbuffered DIMMs.

18. The method of claim 17, wherein the three or more parallel protocol memory module channels conform to a double data rate synchronous dynamic random access memory (DDR SDRAM) protocol, wherein the step of making substantially transparent to the native FB-DIMM protocol host controller comprises the step of:

making substantially transparent to the native FB-DIMM protocol host controller an employment of the translator to communicatively interconnect:

the serial protocol bus that carries the three or more READ commands and follows the native FB-DIMM protocol; and the three or more parallel protocol memory module channels that conform to the DDR SDRAM protocol and comprise the plurality of DDR registered and/or unbuffered DIMMs.

\* \* \* \* \*